US011397055B2

(12) United States Patent
Ben-Menahem et al.

(10) Patent No.: US 11,397,055 B2
(45) Date of Patent: Jul. 26, 2022

(54) TWO-PHASE THERMODYNAMIC SYSTEM HAVING A POROUS MICROSTRUCTURE SHEET WITH VARYING SURFACE ENERGY TO OPTIMIZE UTILIZATION OF A WORKING FLUID

(71) Applicant: MICROSOFT TECHNOLOGY LICENSING, LLC, Redmond, WA (US)

(72) Inventors: Shahar Ben-Menahem, Mountain View, CA (US); Tzu-Yuan Lin, San Jose, CA (US); Michael Nikkhoo, Saratoga, CA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 11 days.

(21) Appl. No.: 17/164,811

(22) Filed: Feb. 1, 2021

(65) Prior Publication Data

US 2021/0207893 A1 Jul. 8, 2021

Related U.S. Application Data

(60) Division of application No. 16/352,633, filed on Mar. 13, 2019, now Pat. No. 10,935,325, which is a
(Continued)

(51) Int. Cl.
*F28D 15/00* (2006.01)
*F28D 15/02* (2006.01)
(Continued)

(52) U.S. Cl.
CPC .......... *F28D 15/02* (2013.01); *H01L 23/3675* (2013.01); *H01L 23/427* (2013.01); *F28F 2210/02* (2013.01)

(58) Field of Classification Search
CPC ... F28D 15/02; H01L 23/3675; H01L 23/427; F28F 2210/02
(Continued)

(56) References Cited

U.S. PATENT DOCUMENTS 10,249,884 B2* 4/2019 Yee .................. H01M 6/36

OTHER PUBLICATIONS

"Office Action Issued in European Patent Application No. 19737465. 5", dated Jan. 18, 2022, 3 Pages.
(Continued)

*Primary Examiner* — Davis D Hwu
(74) *Attorney, Agent, or Firm* — Newport IP, LLC; Jacob P. Rohwer (57) ABSTRACT

A vapor-chamber that includes a porous microstructure sheet with varying surface energy across different regions to optimize utilization of a working fluid. Modulating the surface energy of the porous microstructure sheet can minimize the amount of the working fluid that becomes trapped in the condenser region(s) and maximize an aggregate thin-film evaporation area of the working fluid in the evaporator region(s). The condenser region of the vapor-chamber is treated so that the internal surfaces have low surface energy. For example, the treatment may cause the condenser region to become hydrophobic to minimize the amount of fluid that becomes trapped in the condenser. The evaporator region is treated so that the internal surfaces have high surface energy. For example, the treatment may cause the evaporator region to become hydrophilic to induce the formation of large numbers of robust (e.g., dry-out resistant) thin-film evaporation sites.

20 Claims, 7 Drawing Sheets

Related U.S. Application Data continuation-in-part of application No. 16/147,416, filed on Sep. 28, 2018, now Pat. No. 10,962,298.

(51) Int. Cl.
*H01L 23/367* (2006.01)
*H01L 23/427* (2006.01)

(58) Field of Classification Search
USPC .................................................. 165/104.26
See application file for complete search history.

(56) References Cited

OTHER PUBLICATIONS

"Office Action Issued in European Patent Application No. 19737463.0", dated Jan. 18, 2022, 3 Pages.

* cited by examiner

TWO-PHASE THERMODYNAMIC SYSTEM HAVING A POROUS MICROSTRUCTURE SHEET WITH VARYING SURFACE ENERGY TO OPTIMIZE UTILIZATION OF A WORKING FLUID

PRIORITY APPLICATION

This U.S. non-provisional application is a divisional application that claims the benefit of and priority to the U.S. non-provisional continuation in part application Ser. No. 16/352,633, filed on Mar. 13, 2019, entitled Two-Phase Thermodynamic System Having a Porous Microstructure Sheet with Varying Surface Energy to Optimize Utilization of a Working Fluid, that claims benefit of and priority to U.S. Non-Provisional application Ser. No. 16/147,416, filed Sep. 28, 2018, entitled Two-Phase Thermodynamic System Having a Porous Microstructure Sheet to Increase an Aggregate Thin-Film Evaporation Area of a Working Fluid, the entire contents of which are incorporated herein by reference.

BACKGROUND

Heat pipes and vapor chambers can be efficient tools for absorbing and dissipating heat that is emitted from external sources located adjacent to designated evaporator regions. The absorbed heat causes a working fluid to evaporate from a liquid phase into a vapor phase which stores the absorbed heat in latent form at a slightly lower temperature. The vapor phase of the working fluid then flows to condenser regions, where it condenses back into the liquid phase, causing the stored latent heat to be released and dissipated into an ambient environment. The condensed liquid is returned back to the evaporator regions, for instance via capillary forces and pressure gradients, so as to continue this cycle. Due to the thermodynamically spontaneous phase-change processes of evaporation and condensation respectively absorbing and releasing latent heat, heat pipes and vapor chambers can potentially behave as highly efficient passive thermal conductors—so long as evaporator regions remain adequately wetted and condenser regions do not "wet out." Unfortunately, conventional vapor chambers do not efficiently utilize the phase changing fluid that is trapped within its internal cavity.

One reason that conventional vapor chambers do not efficiently utilize the phase changing fluid is that the internal cavities often have "high" surface energies within the condenser regions which causes the phase changing fluid to "wet-out" and become trapped in dead spaces of the condenser regions. For example, if an internal surface at a condenser region has a high surface energy which causes good adhesion (e.g., "wet-out"), then the phase changing fluid may flood out and/or become trapped in the internal corners and/or other geometric features in the condenser region. This "trapped" portion of the phase changing fluid is unable to migrate back into the evaporator region and is, therefore, unavailable for continuing to remove heat from the evaporator region. Since the evaporator region continues to absorb heat, the unavailability of the trapped portion of the phase change fluid all too often causes the evaporator region to dry-out and experience a sharp temperature rise.

Another reason that conventional vapor chambers do not efficiently utilize the phase changing fluid is that conventional vapor chambers do not have sufficient evaporation sites within the evaporator regions. For example, the evaporator region may have an undesirable surface geometry for inducing the abundant formation of high-quality evaporation sites. Even when total dry-out is absent or mitigated, both excess "dead water" and sub-optimal evaporation sites contribute to temperature non-uniformity—especially during transient heat injection.

It is with respect to these and other considerations that the disclosure made herein is presented.

SUMMARY

Technologies described herein provide a two-phase thermodynamic system that includes a porous microstructure sheet with varying surface energy across different regions to optimize utilization of a working fluid. As described herein, modulating the surface energy of the porous microstructure sheet can effectively minimize the amount of the phase changing fluid that becomes trapped in the condenser region(s) and maximize an aggregate thin-film evaporation area of a working fluid in the evaporator region(s). Generally described, embodiments disclosed herein include a porous microstructure sheet that is disposed at a liquid-vapor boundary of a working fluid that is contained within the two-phase thermodynamic system. The porous microstructure sheet includes a plurality of pores through which the working fluid flows from a liquid flow path on one side of the porous microstructure sheet to a vapor flow path on the other side of the porous microstructure sheet. As described herein, the porous microstructure sheet improves the efficiency of evaporation of the working fluid within the evaporator region(s) and, in some embodiments, condensation within the condenser region(s).

Within the condenser region, the two-phase thermodynamic system may be treated (e.g., via chemical bath techniques) so that the internal surfaces have low surface energy (i.e., relative to the evaporator region) with respect to the working fluid. For example, in an implementation in which the working fluid is water (i.e., $H_2O$), the treatment may be appropriately selected and applied to cause the condenser region to become hydrophobic. As used herein, all references to local "surface energy" refer to minus the internal energy on the fluid/solid boundary per unit surface area at the referenced local region. It will be appreciated that lowering the surface energy prevents the working fluid from becoming trapped within geometrically tight spaces (e.g., individual pores of the porous microstructure sheet) of the condenser region. In this way, the liquid fraction of the working fluid flows freely back to the evaporator region.

Within the evaporator region, the two-phase thermodynamic system may be treated (e.g., via chemical bath techniques) so that the internal surfaces have high surface energy (i.e., relative to the condenser region) with respect to the working fluid. For example, in an implementation in which the working fluid is water (i.e., $H_2O$), the treatment may be appropriately selected and applied to cause the evaporator region to become hydrophilic. It will be appreciated that raising the surface energy ensures that the working fluid sufficiently wets-out the internal surfaces of the individual pores (e.g., of the porous microstructure sheet) that reside within the evaporator region. In this way, the working fluid is induced to abundantly form thin-film evaporation regions.

In an exemplary embodiment, a thermodynamic system includes walls that form a cavity which contains a working fluid in two phases (i.e., a liquid phase and a vapor phase). During operation, the liquid phase of the working fluid absorbs heat that is generated and/or transferred by a heat source that is external to the device. In some instances, the heat source may be physically touching a portion of the walls of the thermodynamic system. The absorbed heat continually converts mass of the working fluid from the liquid phase into the vapor phase, which then transfers this heat in latent form away from the heat source. Specifically, inside the cavity is an evaporator region or regions for absorbing heat to convert a liquid fraction of the working fluid into a vapor fraction of the working fluid. The working fluid may be a bi-phase fluid that evaporates from a liquid state into a gaseous (vapor) state upon absorbing latent heat. The working fluid may then flow through the cavity, in the vapor state, to carry the absorbed latent heat away from the evaporator region. Exemplary working fluids include, but are not limited to, water, refrigerant substances (e.g., R134), ammonia-based liquids, or any other fluid suitable for efficient absorption and release of heat to effect phase changes (evaporation and condensation respectively) change a liquid and a gaseous (vapor) state.

Inside the cavity there is also a condenser region or regions for releasing the latent heat out of the working fluid and expelling this released heat into an external environment. This release of latent heat occurs via spontaneous condensation wherein the vapor fraction is continually converted back into the liquid fraction. It will be appreciated by those skilled in the art that the specific amount (e.g., mass) of the vapor fraction that condenses back into the liquid fraction in any given time interval of operation depends on the specific amount of latent heat that is dissipated from the vapor fraction. It will also be appreciated that in steady state operation, this mass amount is equal to the mass amount of liquid fraction that is evaporated (converted into the vapor phase) during an equal duration of time. It will further be appreciated that in steady-state operation, the total heat power flowing into all evaporator region(s) from the external source(s) will be equal to the total heat power flowing out of all condenser region(s) into the external environment.

In some embodiments, the liquid flow path may include a plurality of ribs that form channels extending from the condenser region(s) back to the evaporator region(s). The channels fill up (at least partially) with the liquid fraction as it condenses at the condenser region(s). The channels then draw this liquid fraction back to the evaporator region (e.g. via capillary action). It can be appreciated that the channels may form a wicking structure that exploits capillary action to ensure the evaporator region remains sufficiently wetted by continually drawing the liquid fraction back into the evaporator region—ideally at sufficient rates to keep up with evaporation.

The thermodynamic system may include a porous microstructure sheet that forms a boundary between the liquid flow path and the vapor flow path. For example, in embodiments where the liquid flow path is generally defined by the channels, the porous microstructure sheet may be disposed over the plurality of ribs that form the channels. The porous microstructure sheet includes a plurality of pores that individually induce the liquid fraction of the working fluid to form thin-film evaporation regions within the evaporator region. A pore density of the porous microstructure sheet may be sufficiently high such that an aggregate thin-film evaporation area of the working fluid is increased within the evaporation region—as compared to conventional systems. For example, it can be appreciated that near where a liquid-vapor boundary nears a solid material (e.g., metal), a liquid may form into one or more distinctively behaving regions.

These distinctively behaving regions may include an adsorbed layer region, a thin-film evaporation region, and an intrinsic meniscus region. It can be appreciated that a relative rate at which the liquid fraction evaporates into the vapor fraction will be greatest at the thin-film evaporation region(s), as compared to the adsorbed layer region and the intrinsic meniscus region of the liquid-vapor boundary. Since the pore-density of the porous microstructure sheet is sufficiently high such that an aggregate thin-film evaporating area of the working fluid is increased as compared to conventional systems, the technologies described herein are suitable for increasing the number and robustness of low-thermal-resistance microscopic evaporation sites for uninterrupted optimum performance.

In various embodiments, the porous microstructure sheet may be in the form of a grid mesh in which the individual pores are repeatably arranged into an ordered grid of pores having defined pore sizes and/or pore shapes. As a specific but nonlimiting example, the individual pores may include four sides which come together to form four interior corners. These "microscopic" interior corners may individually induce the formation of thin-film evaporation regions of the liquid fraction. Furthermore, since the liquid-vapor boundary may be located within the individual pores, thin-film evaporation regions may also form away from the corners on the individual sides of each pore. Thus, even away from corners, each side (edge) of each grid block shaped pore will also function as an evaporator site as evaporation is relatively higher via thin-film evaporation regions of a liquid as opposed to other "deeper" regions of the liquid (e.g., where in intrinsic meniscus region forms).

In some embodiments, at least a portion of the porous microstructure sheet that resides within the condenser region is treated so that the internal surfaces of the individual pores have a relatively lower surface energy than in the evaporator region. In this way, the adhesion between the working fluid and the condenser portion of the porous microstructure sheet is reduced, thereby lessening the tendency of the working fluid to "wet-out" the individual pores. Thus, the working fluid is able to freely flow through the microporous structure from the vapor flow path into the liquid flow path as it condenses. Additionally, in some embodiments, internal surfaces within the condenser region other than those on the porous microstructure sheet may also be treated so as to reduce the surface energy. For example, the entire two-phase thermodynamic system—including the porous microstructure sheet may be assembled and then dipped into a chemical bath for treatment of the condenser region. This further prevents the working fluid from becoming trapped within geometrically tight spaces of the condenser regions so that the working fluid flows freely back to the evaporator region.

In some embodiments, at least a portion of the porous microstructure sheet that resides within the evaporator region is treated so that the internal surfaces of the individual pores have a relatively higher surface energy than in the condenser region. In this way, the adhesion between the working fluid and the evaporator portion of the porous microstructure sheet is increased, thereby increasing the tendency of the working fluid to "wet-out" the pores. Thus, the working fluid induced to abundantly form thin-film evaporation regions within the interior corners of the individual pores. It can be appreciated that increasing the aggregate formation of thin-film evaporation regions increases the rate at which the liquid fraction evaporates into the vapor fraction. Thus, the overall amount of heat that can be effectively transmitted from the liquid fraction into the vapor fraction and then carried to and expelled from the condenser region is maximized.

These and various other features will be apparent from a reading of the following Detailed Description and a review of the associated drawings. This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with another number included within a parenthetical to refer to each individual item. Generic references to the items may use the specific reference number without the sequence of letters.

DETAILED DESCRIPTION

The following Detailed Description describes a two-phase thermodynamic system that includes a porous microstructure sheet with varying surface energy across different regions to optimize utilization of a working fluid. Generally described, embodiments disclosed herein include a porous microstructure sheet that is disposed at a liquid-vapor boundary of a working fluid that is contained within the two-phase thermodynamic system. The porous microstructure sheet includes a plurality of pores through which the working fluid flows from a liquid flow path on one side of the porous microstructure sheet to a vapor flow path on the other side of the porous microstructure sheet.

As described in detail below, increasing the surface energy of the porous microstructure sheet within the evaporator region effectively maximizes an aggregate thin-film evaporation area of the portion of the working fluid that is in the evaporator region(s). It will be appreciated that raising the surface energy ensures that the working fluid sufficiently wets-out the internal surfaces of the individual pores that reside within the evaporator region. In this way, the working fluid is induced to abundantly form thin-film evaporation regions.

Additionally, or alternatively, decreasing the surface energy of the porous microstructure sheet within the condenser region effectively minimizes the amount of the working fluid that becomes trapped in the condenser region(s) in liquid form. More specifically, lowering the surface energy prevents the working fluid from becoming trapped within individual pores and other geometrically tight spaces that reside in the condenser region. In this way, the liquid fraction of the working fluid flows freely back to the evaporator region.

The present invention is applicable to a variety of two-phase thermodynamic systems and approaches for modulating surface energies across different regions of a porous microstructure sheet(s) to increase an aggregate thin-film evaporation area of a working fluid in an evaporator region(s) and/or minimize an amount of the working fluid that becomes trapped in the condenser region(s). Aspects of the invention disclosed herein are predominantly described in the context of a single porous microstructure sheet being disposed over a channel-type wicking structure and that is chemically treated (e.g., via a chemical bath) so that the surface energy of the interior region of the pores is relatively higher in the evaporator region than in the condenser region. While the present invention is not necessarily limited to such embodiments, an appreciation of various aspects of the invention is best gained through a discussion of examples in this context. Accordingly, aspects of the disclosure below that are not expressly recited in the claims are not to be interpreted as limiting of the claims in any way whatsoever.

Figure 1A:
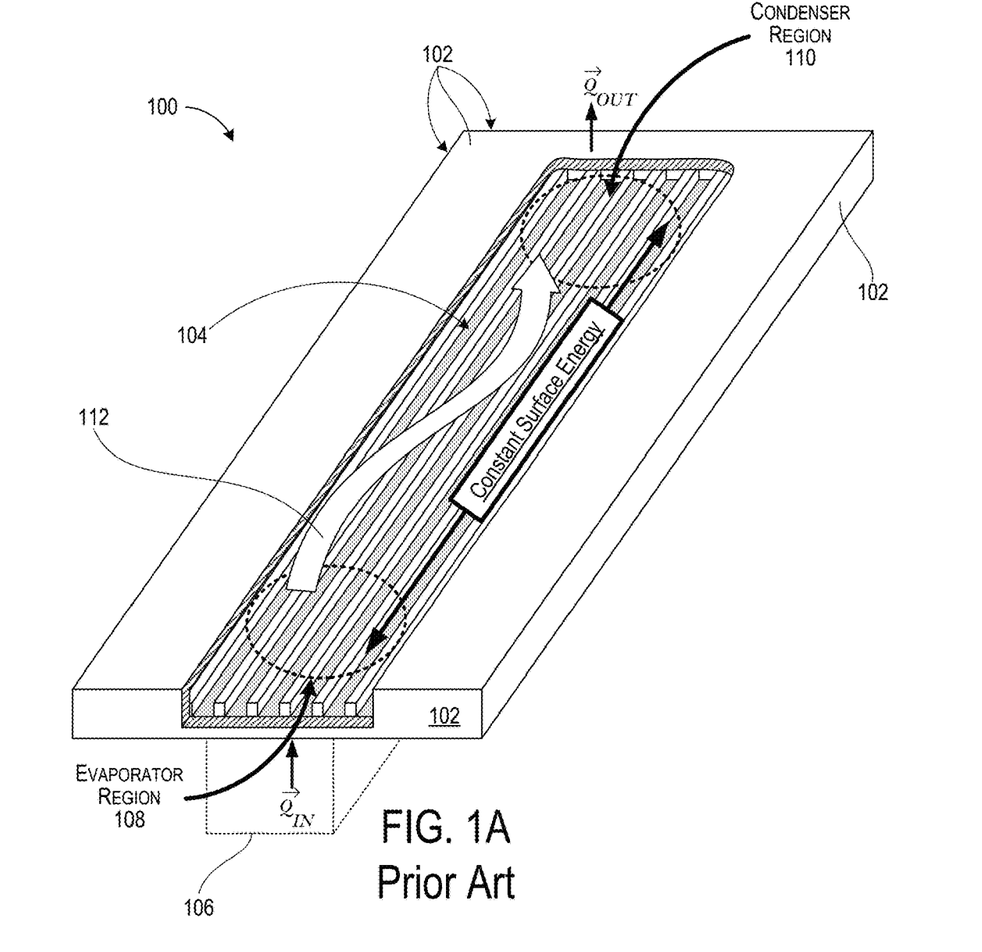
FIG. 1A is a perspective cut-away view of a "prior art" two-phase thermodynamic system that includes a channel-type wicking structure to continually induce newly condensed fluid to flow from a condenser region toward an evaporator region and that has a constant internal surface energy between the condenser region and the evaporator region.

FIG. 1A is a perspective cut-away view of a "prior art" two-phase thermodynamic system 100 that includes a channel-type wicking structure 104 to induce fluid flow from a condenser region 110 to an evaporator region 108 and that has a constant internal surface energy between the condenser region and the evaporator region. As illustrated, the thermodynamic system 100 includes walls 102 that contain a working fluid (omitted from illustration to visually expose the channel-type wicking structure 104). During operation, a heat source 106 (e.g., a Central Processing Unit, a battery, an electronic component, etc.) emits heat that is absorbed into the working fluid at the evaporator region 108 (as shown by the $\vec{Q}_{IN}$ symbol) of the thermodynamic system 100. The absorbed heat causes a liquid fraction of the working fluid to evaporate into a vapor fraction of the working fluid. As additional mass (e.g. as quantified in gram units) of the liquid fraction is continually evaporated into the vapor fraction, some mass of the vapor fraction is displaced towards the condenser region 110. Thus, as additional heat is absorbed into the working fluid converting the liquid fraction into the vapor fraction, latent heat is carried by the vapor fraction through a vapor flow path 112 (shown as a white arrow disposed above the channel-type wicking structure 104) to the condenser region 110. Then, when the vapor fraction reaches the condenser region 110, the latent heat is transferred out of the working fluid (as shown by the $\vec{Q}_{OUT}$ symbol) via a combination of condensation phase change (converting the vapor fraction of the working fluid back into its liquid fraction) and conductive heat transfer out of the device and into the external environment adjacent to the outer device wall in the vicinity of the condenser region.

As the latent heat is released from the condenser region 110 (e.g., through the walls 102 and into the ambient environment), the channel-type wicking structure 104 continually wicks or draws the newly condensed portions of the liquid fraction back into the evaporator region 108. Although somewhat useful for drawing the liquid fraction back into the evaporator region 108, the channel-type wicking structure 104 Is not useful for inducing the formation of large numbers of robust (e.g., dry-out resistant) thin-film evaporation sites. The undesirable quantity and geometry of the evaporation sites produced by the channel-type wicking structure 104 all too often leads to dry-out occurring within the evaporator region 108. Dry-out is a phenomenon wherein the liquid fraction of the working fluid evaporates too fast as heat is absorbed, thereby causing the evaporator region to "dry-out." Dry-out can lead to high localized temperature rises or spikes and, therefore, extreme temperature non-uniformity across the thermodynamic system 100.

As illustrated, the "prior art" two-phase thermodynamic system 100 has a constant surface energy within the cavity that contains the working fluid. For example, the specific level of hydrophobicity, or conversely hydrophilicity, within the evaporator region(s) is substantially identical to that within the condenser region(s)—and any adiabatic region(s) for that matter.

Figure 1B:
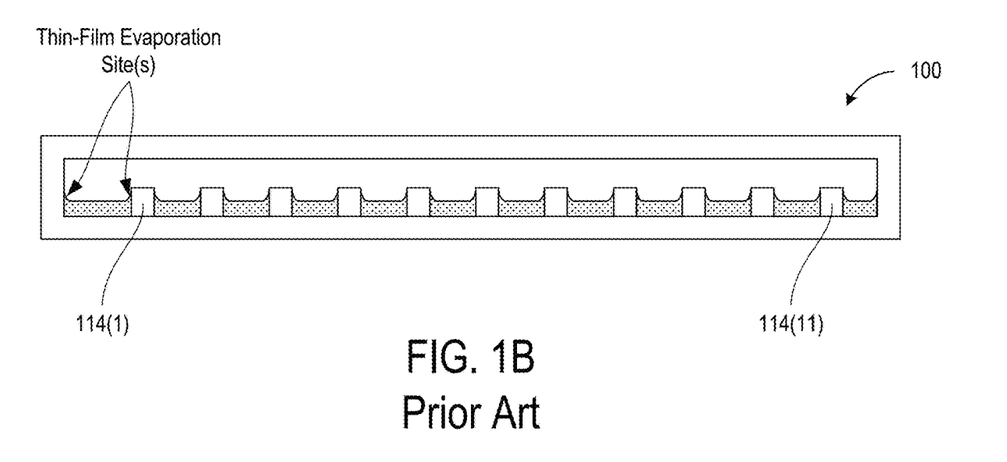
FIG. 1B is a side view of the "prior art" two-phase thermodynamic system of FIG. 1A that illustrates the formation of only two thin-film evaporation sites within each individual channel of the channel-type wicking structure.

FIG. 1B is a side view of the "prior art" two-phase thermodynamic system 100 that illustrates the formation of thin-film evaporation sites within the channel-type wicking structure 104. As illustrated, the thermodynamic system 100 includes eleven ("11") individual ribs 114 (only the first rib 114(1) and the eleventh rib 114(11) are labelled) that together with the side walls form twelve ("12") individual channels through which the liquid fraction of the working fluid is drawn into the evaporator region 108. It can be appreciated that since the thin-film evaporation sites will form where the liquid-vapor boundary nears a solid structure (e.g., the ribs 114 and/or the interior side of the walls 102), in the illustrated example the inner geometry of the thermodynamic system 100 will induce the formation of twenty-four ("24") thin-film evaporation region. Specifically, so long as the level of the working fluid (shown with a dotted fill pattern) remains below the top of the ribs 114, then a single thin-film evaporation region will form against each side of each individual channel.

Figure 2A:
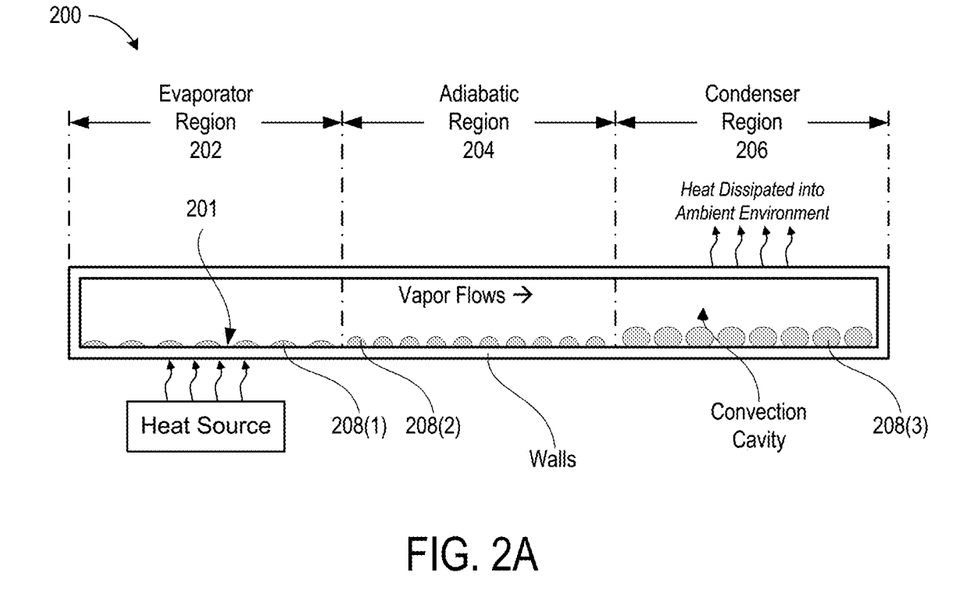
FIG. 2A illustrates an exemplary two-phase thermodynamic system having internal surface energies that vary between an evaporator region and a condenser region.

Turning now to FIG. 2A, illustrated is an exemplary two-phase thermodynamic system 200 having internal surface energies that vary between an evaporator region 202 and a condenser region 206. More specifically, the surface energy of the inner surface(s) 201 within the evaporator region 202 is greater than the surface energy of the inner surface(s) 201 within the condenser region 206. For example, in embodiments in which the working fluid is water (i.e., $H_2O$), the internal surfaces of the condenser region may be treated to increase hydrophobicity whereas the internal surfaces of the evaporator region may be treated to increase hydrophilicity. Lowering the surface energy prevents the working fluid from becoming trapped within the condenser region whereas raising the surface energy ensures that the working fluid sufficiently wets-out the internal surfaces of the evaporator region. In this way, the liquid fraction of the working fluid flows freely back to the evaporator region where it is induced to abundantly form thin-film evaporation regions.

As illustrated, the result of the surface treatment(s) that are applied to the internal surfaces of the two-phase thermodynamic system 200 is that the working fluid is less attracted to the internal surfaces in the condenser region than it is to the internal surfaces in the evaporator region and/or adiabatic (drift). This causes the working fluid to "bead up" (e.g., as it would on a freshly waxed car). Since the working fluid is not attracted to the internal surfaces of the condenser region, the water does not become trapped in corners and other "tight" geometries that would otherwise trap the condensing water. Exemplary such surface treatments include chemical, mechanical, and/or other types of treatments that cause the internal surfaces of the two-phase thermodynamic system 200 to become more hydrophobic (e.g., less hydrophilic and/or less polar) in the condenser region 206 than in the adiabatic region 204 and the evaporator region 202.

In some embodiments, one or more surface treatments may also be applied to the evaporator region 202 to increase the effective surface area. Exemplary such surface treatments include both wet processes (acid, alkaline, or other reactive chemicals) and dry processes (reactive gas, plasma, ions) that can be used to increase surface roughness and/or form micropores/microchannels. The increased and/or geometrically optimized surface area that results from the surface treatment(s) adds to number and/or quality (overall low thermal resistance and robustness) of the evaporation sites—thereby increasing overall vapor chamber performance.

Figure 2B:
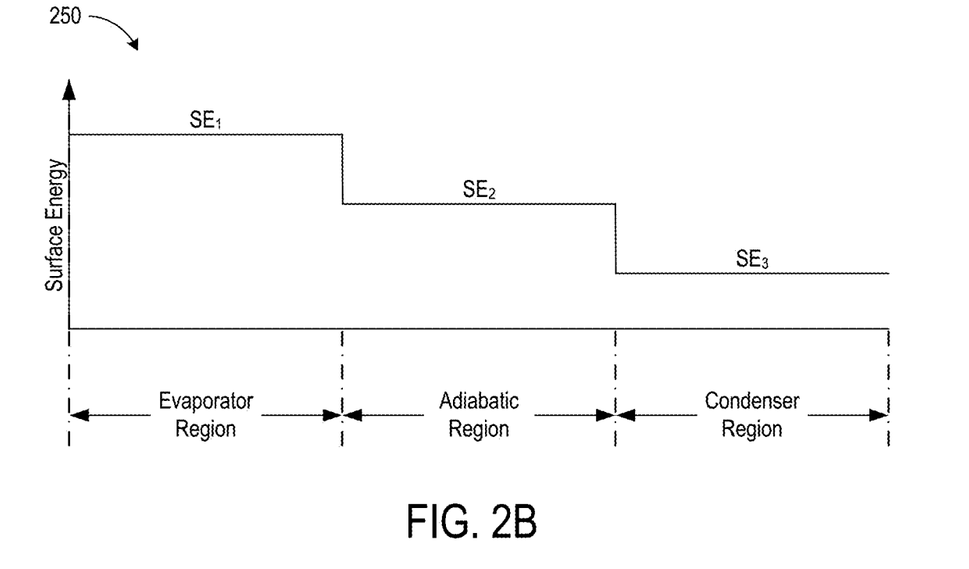
FIG. 2B illustrates a surface energy graph that represents a step-wise variance in the internal surface energies of the two-phase thermodynamic system of FIG. 2A.

Turning now to FIG. 2B, illustrated is a surface energy graph 250 that represents a step-wise variance in the internal surface energies of the two-phase thermodynamic system 200 of FIG. 2A. More specifically, the surface energy graph indicates that the two-phase thermodynamic system 200 has a first surface energy ($SE_1$) within the evaporator region 202, a second surface energy ($SE_2$) within the adiabatic drift region 204, and a third surface energy ($SE_3$) within the condenser 206. In the illustrated embodiment, the first surface energy ($SE_1$) is greater than the second surface energy ($SE_2$) which is greater than the third surface energy ($SE_3$).

FIGS. 2A and 2B are vertically aligned so that portions of the working fluid within each of the evaporator region 202, the adiabatic drift region 204, and the condenser region 206 are illustrated differently to represent their respective wettability of the internal surfaces having the each of the first surface energy ($SE_1$), second surface energy ($SE_2$), and third surface energy ($SE_3$), respectively. Thus, first portions 208(1) of the working fluid are shown to have a low contact angle (e.g., an acute contact angle) between the working fluid and the internal surfaces of the evaporator region 202 that have the first surface energy ($SE_1$). Moreover, second portions 208(2) of the working fluid are shown to have a relatively higher contact angle (e.g., a right/normal contact angle) between the working fluid and the internal surfaces of the adiabatic region 204 that have the second surface energy ($SE_2$). Finally, third portions 208(3) of the working fluid are shown to have an even higher contact angle (e.g., an obtuse contact angle) between the working fluid and the internal surfaces of the condenser region 206 that have the third surface energy ($SE_3$).

Although the variations in the internal surface energies of the two-phase thermodynamic system 200 are shown as being step-wise, other configurations are contemplated and within the scope of the present disclosure. For example, other embodiments of the systems disclosed herein may have internal surface energies that linearly and/or exponentially vary between the condenser region and/or the adiabatic region and/or the evaporator region.

Figure 3A:
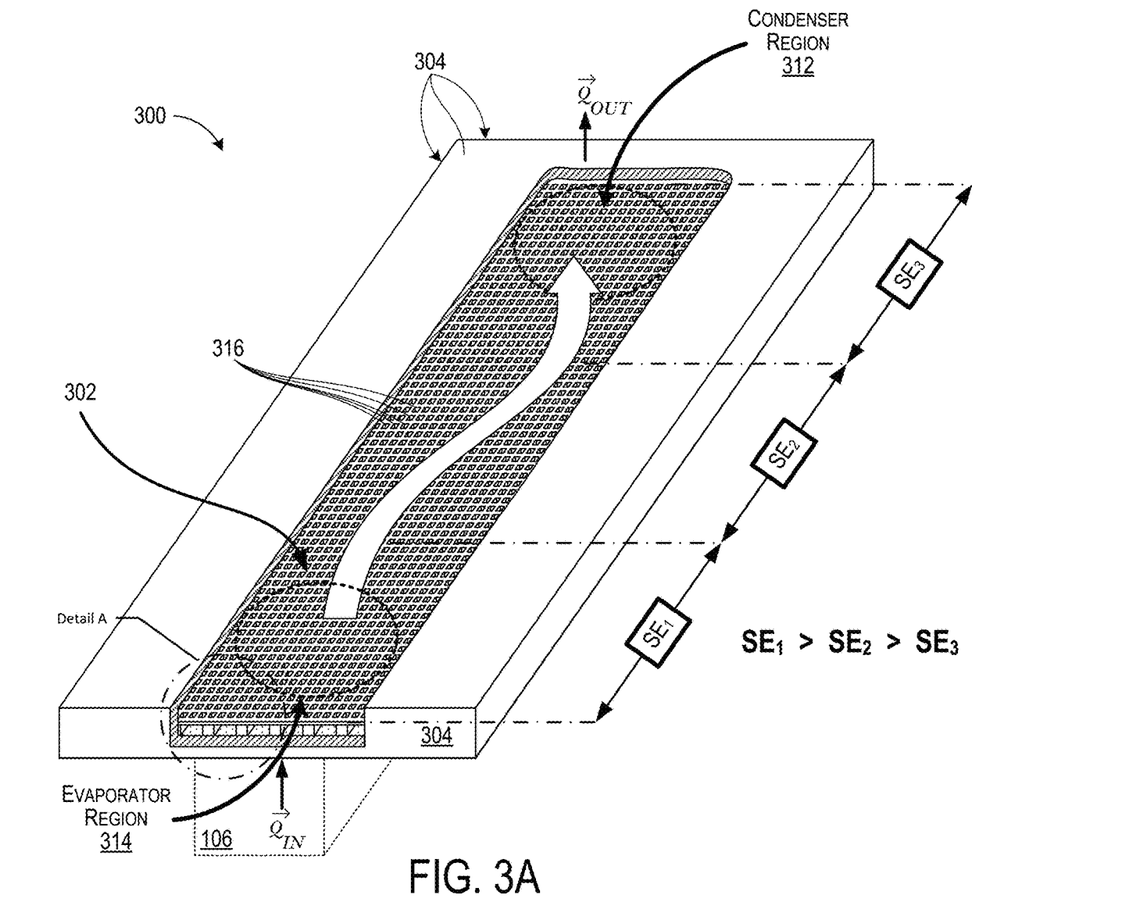
FIG. 3A illustrates an exemplary two-phase thermodynamic system that includes a porous microstructure sheet having varying surface energy across different regions to optimize utilization of a working fluid.
Figure 3B:
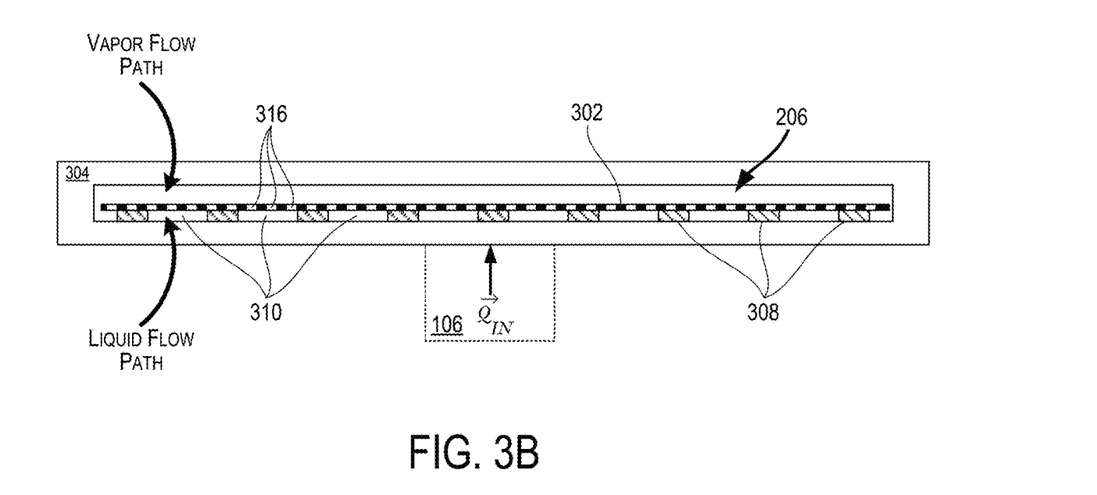
FIG. 3B illustrates a side view of the two-phase thermodynamic system of FIG. 3A.

Turning now to FIG. 3A, illustrated is an exemplary two-phase thermodynamic system 300 that includes a porous microstructure sheet 302 having varying surface energy across different regions to optimize utilization of a working fluid. The porous microstructure sheet 302 also includes a plurality of pores 316 that, within the evaporator region 314, induce the formation of numerous thin-film evaporation sites (also referred to herein as "thin-film evaporation regions") to increase an aggregate thin-film evaporation area of a working fluid. FIG. 3B illustrates a side view of the two-phase thermodynamic system 300 of FIG. 3A. As illustrated, the thermodynamic system 300 includes walls 304 that form a cavity 306 (labelled only in FIG. 3B). The cavity 306 contains the working fluid in two phases (i.e., a liquid phase and a vapor phase). It is worth noting that in order to expose the structural details of the porous microstructure sheet, the working fluid is omitted from both of FIGS. 3A and 3B. During operation, the liquid phase of the working fluid absorbs heat that is generated and/or transferred by a heat source 106 that is external to walls 304 of the two-phase thermodynamic system 300. As described above, the absorbed heat continually converts mass of the working fluid from the liquid phase into the vapor phase. The vapor phase then transfers this heat in latent form away from the heat source 106.

In the illustrated example, the two-phase thermodynamic system 300 includes a plurality of ribs 308 that together form a plurality of channels 310. The channels 310 form a liquid flow path through which the liquid phase of the working fluid flows from a condenser region 312 back to an evaporator region 314. The channels 310 induce capillary action on the liquid fraction of the working fluid to draw the liquid fraction toward the evaporator region 314. In some embodiments, the channels 310 may be roughly one-hundred microns wide.

In the illustrated embodiment, the porous microstructure sheet 302 is disposed over the top of the ribs 308 to induce the liquid fraction of the working fluid to form thin-film evaporation regions within the evaporator region 314. Specifically, the porous microstructure sheet 302 includes a plurality of individual pores 316 that may be specifically shaped so as to cause thin-film evaporation regions to be formed therein. In this way, if the cavity 306 is filled with an appropriate amount of the working fluid such that a liquid-vapor boundary forms slightly above the ribs 308, then small amounts of the liquid fraction will be drawn into individual ones of the pores 316 that reside within the evaporator region 314 where they are induced to form thin-film evaporation regions. It can be appreciated therefore that the porous microstructure sheet 302 may be disposed substantially at the liquid-vapor boundary such that the vapor flow path is on one side of the porous microstructure sheet 302 (e.g., above the sheet as shown in FIGS. 3A and 3B) and the liquid flow path is on the opposite side of the porous microstructure sheet 302 (e.g., below the sheet as shown in FIGS. 3A and 3B).

The porous microstructure sheet 302 may have a pore density that is optimized so as to increase an aggregate thin-film evaporation area of the working fluid—as compared to the amount of thin-film evaporation area that would form due to the channel-type wicking structure alone (e.g., as described in relation to FIGS. 1A and 1B). It should be appreciated that inclusion of the porous microstructure sheet 302 at (or near) a liquid-vapor boundary within the two-phase thermodynamic system 300 may substantially decrease the overall thermal resistance across all liquid-vapor interfaces (menisci) of the working fluid. Thus, the porous microstructure sheet 302 may enable the two-phase thermodynamic system 300 to transmit latent heat across the liquid-vapor interface at substantially higher rates than conventional systems and, therefore, exploit phase-change processes for maximizing thermal conductivity at higher throughput heat power rates than conventional systems.

In various embodiments, the individual pores 316 within the porous microstructure sheet 302 may be "microscopic" in size. As some specific but nonlimiting examples, the individual pores 316 may have a total pore area of: less than 2500 square microns ($\mu$) (e.g., as would be formed by a 50$\mu$ by 50$\mu$ square pore), less than 2025 square microns ($\mu$) (e.g., as would be formed by a 45$\mu$ by 45$\mu$ square pore), less than 1600 square microns ($\mu$) (e.g., as would be formed by a 40$\mu$ by 40$\mu$ square pore), less than 1225 square microns ($\mu$) (e.g., as would be formed by a 35$\mu$ by 35$\mu$ square pore), less than 900 square microns ($\mu$) (e.g., as would be formed by a 30$\mu$ by 30$\mu$ square pore), less than 625 square microns ($\mu$) (e.g., as would be formed by a 25$\mu$ by 25$\mu$ square pore), less than 400 square microns ($\mu$) (e.g., as would be formed by a 20$\mu$ by 20$\mu$ square pore), less than 225 square microns ($\mu$) (e.g., as would be formed by a 15$\mu$ by 15$\mu$ square pore), or less than 100 square microns ($\mu$) (e.g., as would be formed by a 10$\mu$ by 10$\mu$ square pore).

As shown in FIG. 3A, the surface energy of the porous microstructure sheet 302 varies in a step-wise fashion. Specifically, the porous microstructure sheet 302 has a first surface energy ($SE_1$) within at least a portion of the evaporator region 314, a second surface energy ($SE_2$) within at least a portion of an adiabatic draft region (e.g., a region that lies the evaporator region 314 and the condenser region 312), and a third surface energy ($SE_3$) within at least a portion of the condenser region 312. As shown, the first surface energy ($SE_1$) is greater than the second surface energy ($SE_2$) which is greater than the third surface energy ($SE_3$). Thus, in embodiments in which the working fluid is water-based, the hydrophilicity of the porous microstructure sheet 302 is greatest within the evaporator region 314 and is the lowest within the condenser region 312.

In some embodiments, the first surface energy ($SE_1$) is achieved by treating a first portion of the portion microstructure sheet 302 in accordance with a first surface treatment to raise the surface energy from a base surface energy of a raw material that is used to construct the porous microstructure sheet 302. For example, the porous microstructure sheet 302 may be constructed from a titanium-based or copper-based raw material having some base surface energy. Then, the first surface treatment may be applied to the porous microstructure sheet 302 to increase the hydrophilicity of the titanium-based or copper-based raw material.

In some embodiments, the third surface energy ($SE_3$) is achieved by treating a different portion of the portion microstructure sheet 302 in accordance with a second surface treatment to lower the surface energy from a base surface energy of the raw material from which the porous microstructure sheet 302 is made. For example, the second surface treatment may be applied to the porous microstructure sheet 302 to increase the hydrophobicity of the titanium-based or copper-based raw material.

In some embodiments, the second surface energy ($SE_2$) corresponds to the base surface energy of a raw material that is used to construct the porous microstructure sheet 302. For example, the adiabatic region of the porous microstructure sheet 302 may be left untreated. In alternate embodiments, the second surface energy ($SE_2$) may be raised above the base surface energy or lowered below the base surface energy.

Figure 4:
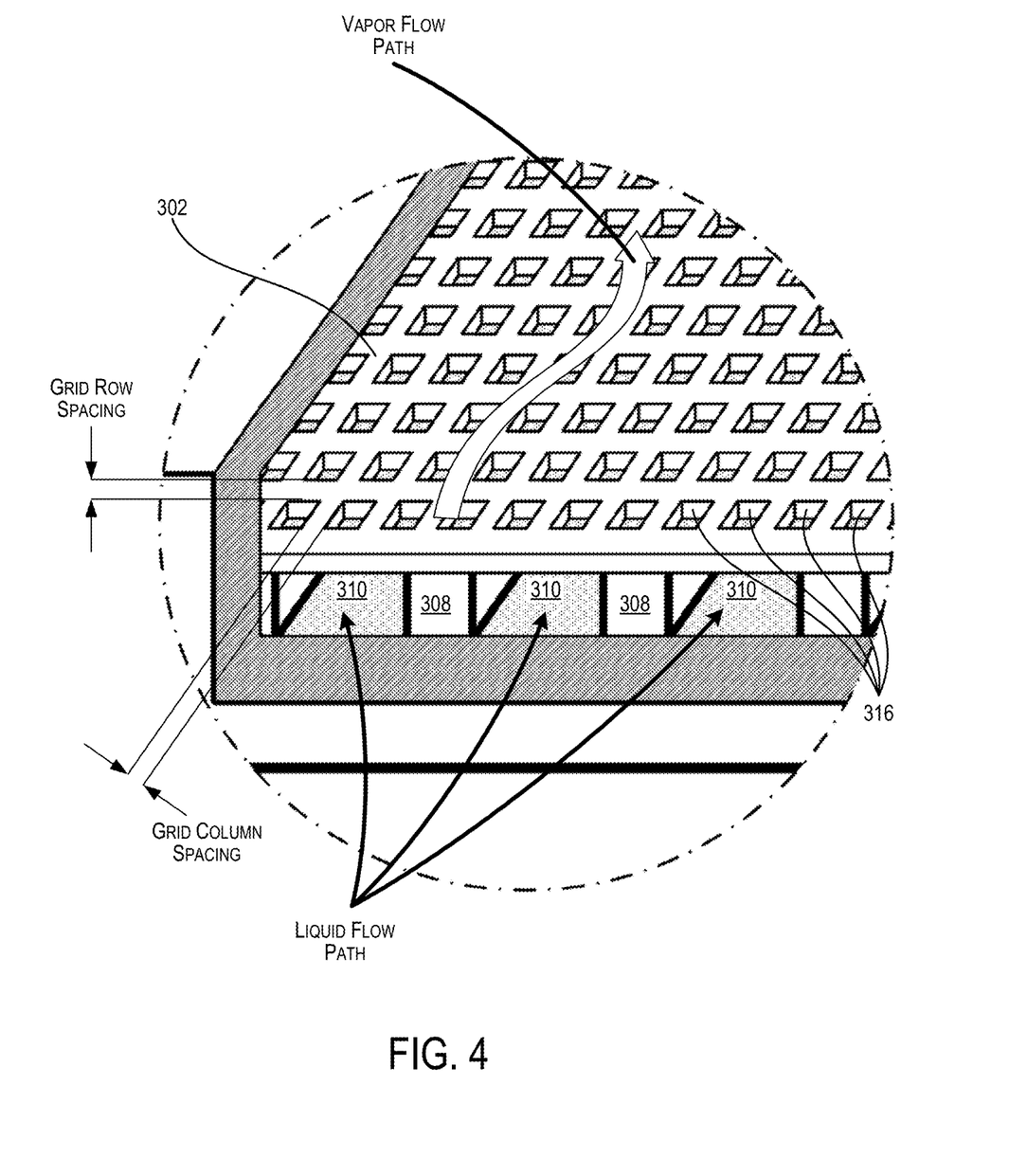
FIG. 4 illustrates a detailed view of the two-phase thermodynamic system that corresponds to the particular section labelled "Detail A" in FIG. 3A. The working fluid intentionally omitted from FIG. 4 for the purpose of fully revealing the structure of the two-phase thermodynamic system.

Turning now to FIG. 4, illustrated is a detailed view of the two-phase thermodynamic system 300 of FIG. 3A. The detailed view shown in FIG. 4 specifically corresponds to the circle that is labeled Detail A in FIG. 3A. In the illustrated example, the porous microstructure sheet 302 is in the form a grid mesh in which the individual pores 316 are repeatedly arranged into an ordered grid of pores having predefined and/or repeatable pore sizes. For example, as illustrated, the individual pores 316 are arranged into ordered columns and rows of pores. In this example, the individual rows of pores are separated from one another by a predefined and repeatable grid row spacing whereas the individual columns of pores are separated from one another by a predefined and repeatable grid column spacing. In some implementations, the grid row spacing may be nominally equal to the grid column spacing. In some implementations, the grid row spacing may be nominally different from the grid column spacing. In some implementations, the "nominal" grid row spacing and/or the grid column spacing may be between 50 microns and 40 microns, between 40 microns and 30 microns, between 30 microns and 20 microns, between 20 microns and 10 microns, or less than 10 microns.

In the illustrated example, the individual pores include four sides which come together to form four interior corners. As described in more detail below in relation to FIG. 7, individual thin-film evaporation regions may be formed within these interior corners. Furthermore, since the liquid-vapor boundary may be located within the individual pores, thin-film evaporation regions may also form away from the corners on the individual sides of each pore. Thus, even away from corners, each side (edge) of each grid block will also function as an evaporator site as evaporation is relatively higher via thin-film evaporation regions of a liquid as opposed to other "deeper" regions of the liquid. It can be appreciated from FIG. 4 that since the individual pores 316 and interior corners thereof are much more numerous than the individual sides of the ribs 308, the number of thin-film evaporation regions that are formed within the two-phase thermodynamic system 300 will be substantially greater than would be formed within the "prior art" system 100 described in relation to FIGS. 1A and 1B. It can further be appreciated that although those thin-film evaporation regions that would be formed against the ribs of the system 100 individually be larger than those formed within the individual pores 316, the aggregate area of the thin-film evaporation regions formed against the ribs of the system 100 will be substantially less than the aggregate are of the thin-film evaporation regions formed within the porous microstructure sheet 302.

It can be appreciated from FIG. 4 that in embodiments in which the porous microstructure sheet 302 is disposed over the top of ribs 308 that form channels 310, the width and/or height of the individual pores may be substantially less than the width of the individual channels 310. In some implementations, the individual channels 310 span a width that is at least twice as long as the width of the individual pores 316. As a specific but nonlimiting example, the individual pores 316 may be substantially square pores that sides that span 50 microns (or less) while the individual channels 310 may span 100 microns (or more). As another specific but nonlimiting example, the individual pores 316 may span 40 microns (or less) while the individual channels 310 may span 100 microns (or more). As another specific but nonlimiting example, the individual pores 316 may span 30 microns (or less) while the individual channels 310 may span 100 microns (or more). As another specific but nonlimiting example, the individual pores 316 may span 20 microns (or less) while the individual channels 310 may span 100 microns (or more).

In some embodiments, the porous microstructure sheet illustrated in FIGS. 3A through 4 is formed by etching the individual pores 316 into a metallic foil sheet. It can be appreciated that various dry etching techniques facilitate the formation of microstructures having relatively high aspect ratio. For example, various dry etching techniques enable the formation of deep "pin" holes type microstructures. An exemplary such dry-etching technique may include, but is not limited to, reactive-ion etching which is commonly used in microfabrication. In addition to dry etching techniques, any other manufacturing technique that is suitable for forming the plurality of pores 316 into a metallic foil may also be deployed to form the porous microstructure sheet 302.

Figure 5:
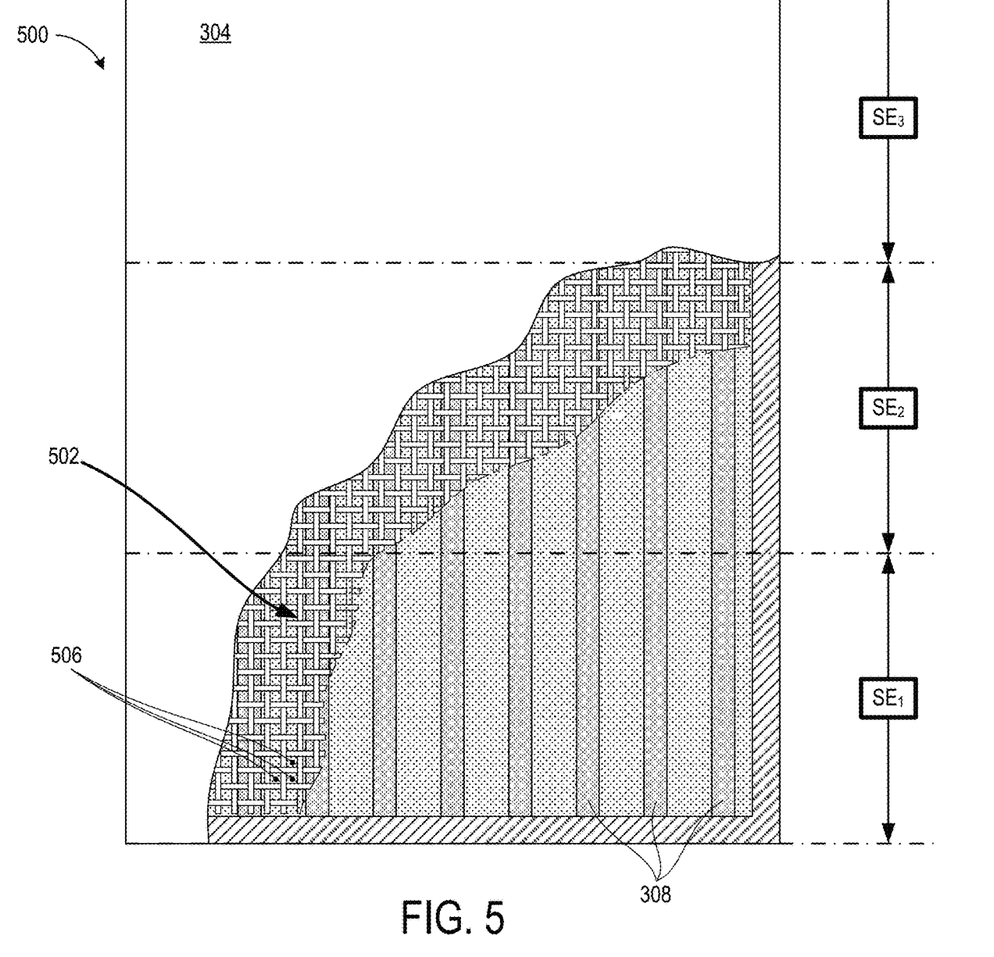
FIG. 5 illustrates a top view of an alternative embodiment of the two-phase thermodynamic system which has a porous microstructure sheet that is formed by a plurality of metallic fibers that are interwoven together.

Turning now to FIG. 5, illustrated is top view of an exemplary two-phase thermodynamic system 500 that includes a porous microstructure sheet 502 that is formed by a plurality of metallic fibers 504. More specifically, the porous microstructure sheet 502 is formed by weaving the plurality of metallic fibers 504 together so that individual metallic fibers 504 are interconnected with other metallic fibers 504 to form a plurality of pores 506. In various embodiments, the "weave" of metallic fibers 504 includes multiple different arrays of metallic fibers 504 that extend in multiple different directions. In the specific but nonlimiting example illustrated in FIG. 5, the "weave" of metallic fibers 504 that makes up the porous microstructure sheet 502 includes a first array of metallic fibers 504 that extend in a first direction (illustrated vertically) and a second array of metallic fibers that extend in a second direction (illustrated horizontally). In this example, individual pores 506 are formed by the weaved combination of four individual metallic fibers 504. In various embodiments, the "weave" of metallic fibers 504 that makes up the porous microstructure sheet 502 is formed from copper fibers, aluminum fibers, titanium fibers, and/or stainless-steel fibers.

It can be appreciated that in FIG. 5 a portion of the wall 304 is cut-away to reveal an inner portion of the two-phase thermodynamic system 500. It can further be appreciated that a relatively smaller portion of the porous microstructure sheet 504 is also cut-away to reveal an unobstructed top view of a channel-type wicking structure that is formed by a plurality of ribs 308. Thus, the two-phase thermodynamic system 500 is generally similar to the two-phase thermodynamic system 300 with that the porous microstructure sheet 502 is formed from a "weave" of interconnected metallic fibers 504 whereas the porous microstructure sheet 302 is formed by cutting, stamping, etching, or otherwise adding pores to a metallic foil sheet.

As shown in FIG. 5, the surface energy of the porous microstructure sheet 502 between different regions of the system 500. Specifically, the porous microstructure sheet 502 has a first surface energy ($SE_1$) within at least a portion of the evaporator region, a second surface energy ($SE_2$) within at least a portion of an adiabatic draft region (e.g., a region that lies the evaporator region and the condenser region), and a third surface energy ($SE_3$) within at least a portion of the condenser region. Similar to FIG. 3A, the first surface energy ($SE_1$) may be greater than the second surface energy ($SE_2$) which may be greater than the third surface energy ($SE_3$). Thus, in embodiments in which the working fluid is water-based, the hydrophilicity of the porous microstructure sheet 502 may be greater within the evaporator region than in the condenser region. As described above, the surface energy may vary in a step-wise fashion, linearly, or exponentially between the condenser region and/or the adiabatic region and/or the evaporator region.

Figure 6:
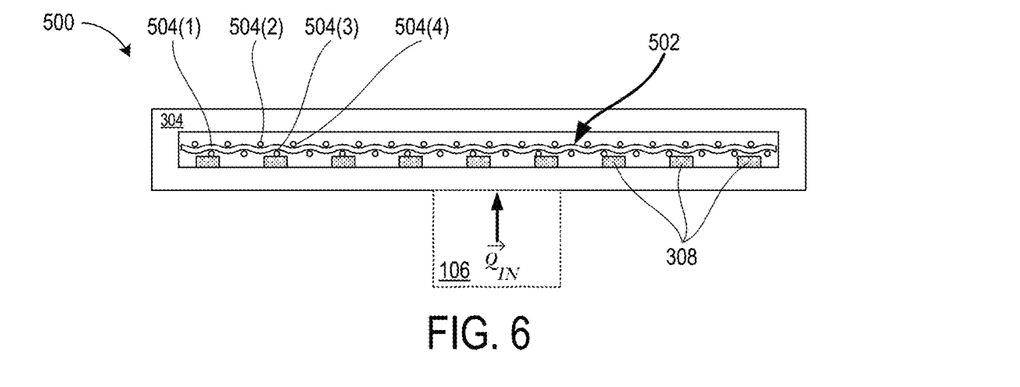
FIG. 6 is a side view of the two-phase thermodynamic system of FIG. 5 which further illustrates how the individual metallic fibers may be woven together.

FIG. 6 is a side view of the two-phase thermodynamic system 500 of that further illustrates the individual metallic fibers 504 being woven together. The side view of FIG. 6 is taken at a cross section that corresponds to a first metallic fiber 504(1). In the illustrated example, the first metallic fiber 504(1) is woven underneath a second metallic fiber 504(2), and then over the top of a third metallic fiber 504(3), and then underneath a fourth metallic fibers, and so on. In some embodiments, the individual metallic fibers 504 of the porous microfiber sheet 502 are interconnected at predetermined and repeatable intervals. As a specific but non-limiting example, the individual metallic fibers 504 may be interconnected at predefined and repeatable spacings.

It can be appreciated that in embodiments in which a porous microstructure sheet (e.g., 302 and/or 502) is disposed directly over a channel-type wicking structure, some portion of the working fluid may become trapped between the top of the individual ribs 308 and the porous microstructure sheet. This results in this "trapped" portion of the working fluid becoming inactive (e.g., "dead") in the sense that it ceases to participate in the heat dissipation action that is desired of the two-phase thermodynamic system. In order to mitigate this unfortunate phenomenon, in various embodiments of the two-phase thermodynamic system disclosed herein the porous microstructure sheet is welded to the top of the individual ribs 308. It can be appreciated that by welding the porous microstructure sheet to the "shoulder" (e.g., top) of the individual ribs, the amount of the working fluid that becomes "dead" (e.g., trapped) may be minimized. In this way, a smaller amount of the bi-phase fluid will be needed to achieve a desired amount of heat dissipation ability.

Figure 7:
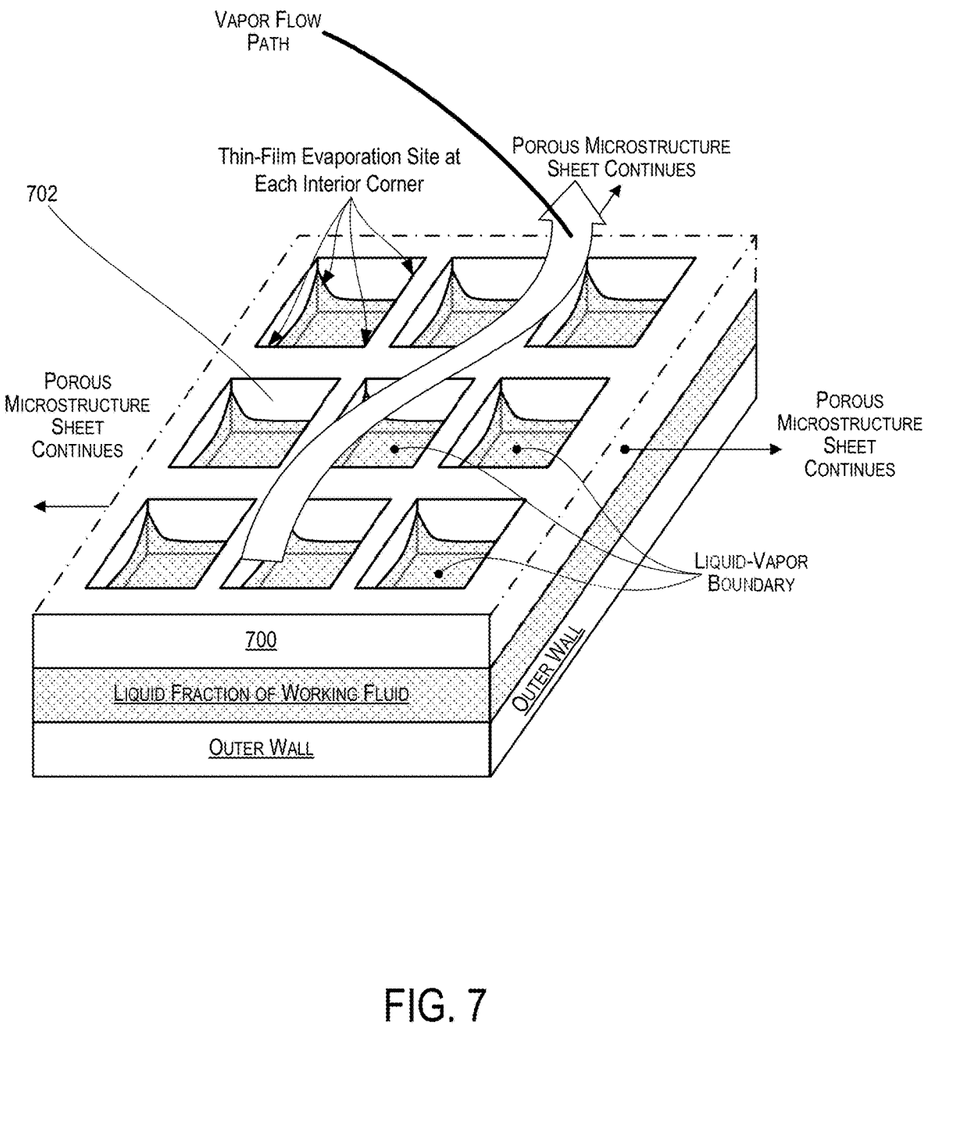
FIG. 7 illustrates an enlarged view of an exemplary porous microstructure sheet in which the individual pores are rectangular in shape and in which thin-film evaporation regions of the working fluid are shown to be formed within the interior corners of the individual pores.

Turning now to FIG. 7, illustrated is an enlarged view of an exemplary porous microstructure sheet 700 at a region which has a high surface energy with respect to the working fluid (e.g., a hydrophilic surface if the working fluid is water). In the illustrated embodiment, the individual pores 702 are rectangular in shape and are shown as forming thin-film evaporation regions of the working fluid are shown to be formed within the interior corners of the individual pores. As illustrated, the individual pores 702 are arranged according to an ordered grid of pores (e.g., an arrangement of pores having rows or pores and columns of pores).

The exemplary microporous microstructure sheet 700 is illustrated as being disposed at a liquid-vapor boundary of the working fluid. Specifically, a liquid fraction of the working fluid is shown as being disposed underneath the porous microstructure sheet 700 and above an outer wall. In this way, disposed underneath the porous microstructure sheet 700 is a liquid flow path through which the illustrated liquid fraction of the working fluid is able to return from the condenser region (not shown in FIG. 7) to the evaporator region (also not shown in FIG. 7). It should be appreciated that FIG. 7 omits one or more outer walls which form the cavity and that these outer walls are omitted in order to provide an adequate and uncluttered view of the thin-film evaporation sites being formed within the porous microstructure sheet.

As further illustrated, a small portion of the liquid fraction of the working fluid collects within the individual corners of the individual pores 702. It will be appreciated by those skilled in the art that the liquid fraction will form thin-film evaporation regions within the corners. Thus, under conditions in which the liquid-vapor boundary is disposed within the individual pores of the porous microstructure sheet 700, thin-film evaporation regions may form at each of the interior corners of the pores. For individual pores as illustrated that have four interior corners, at least four thin-film evaporation regions will form within each of the individual pores. Furthermore, the size of the individual pores may be specifically sized such that a substantial fraction of the liquid-vapor boundary is formed into a "thin-film" in the sense that that fraction has a relatively lower thermal resistance than other fractions of the liquid-vapor boundary. In this way, by spacing the individual pores closely together with a relatively small separation between pores (e.g., 10 microns, 20 microns, etc.), the aggregate area of the liquid-vapor boundary that is induced to forming into a thin-film may be substantially increased over conventional vapor chambers and heat pipes. It can further be appreciated that the relatively small size of the thin-film evaporation regions formed within the porous microstructure sheets described herein will have increased (e.g., smaller radii) meniscus curvatures as compared to conventional vapor chambers. The increased meniscus curvatures will, in turn, will increase the resistance of most evaporation sites to dry-out at higher heat-power through-put levels (especially when transient).

Although illustrated as highly ordered structure (with regular inter-pore channels—not shown in Figures), one skilled in the art will recognize that the porous microstructure sheet may also include pores as randomly interconnected structures such as, for example, openings in a wire mesh, or to high-aspect-ratio liquid regions between solid fibers in a fibrous-bundle wick component. Those skilled in the art will further recognize that term "pore" may also refer to void volumes between grains in a sintered-metal-powder wick component that are partially filled with liquid. Thus, in various embodiments, the porous microstructure sheet may be in the form of a wire mesh sheet and/or a sintered metal-power sheet that is disposed over the top of a channel-type wicking structure.

Figure 8:
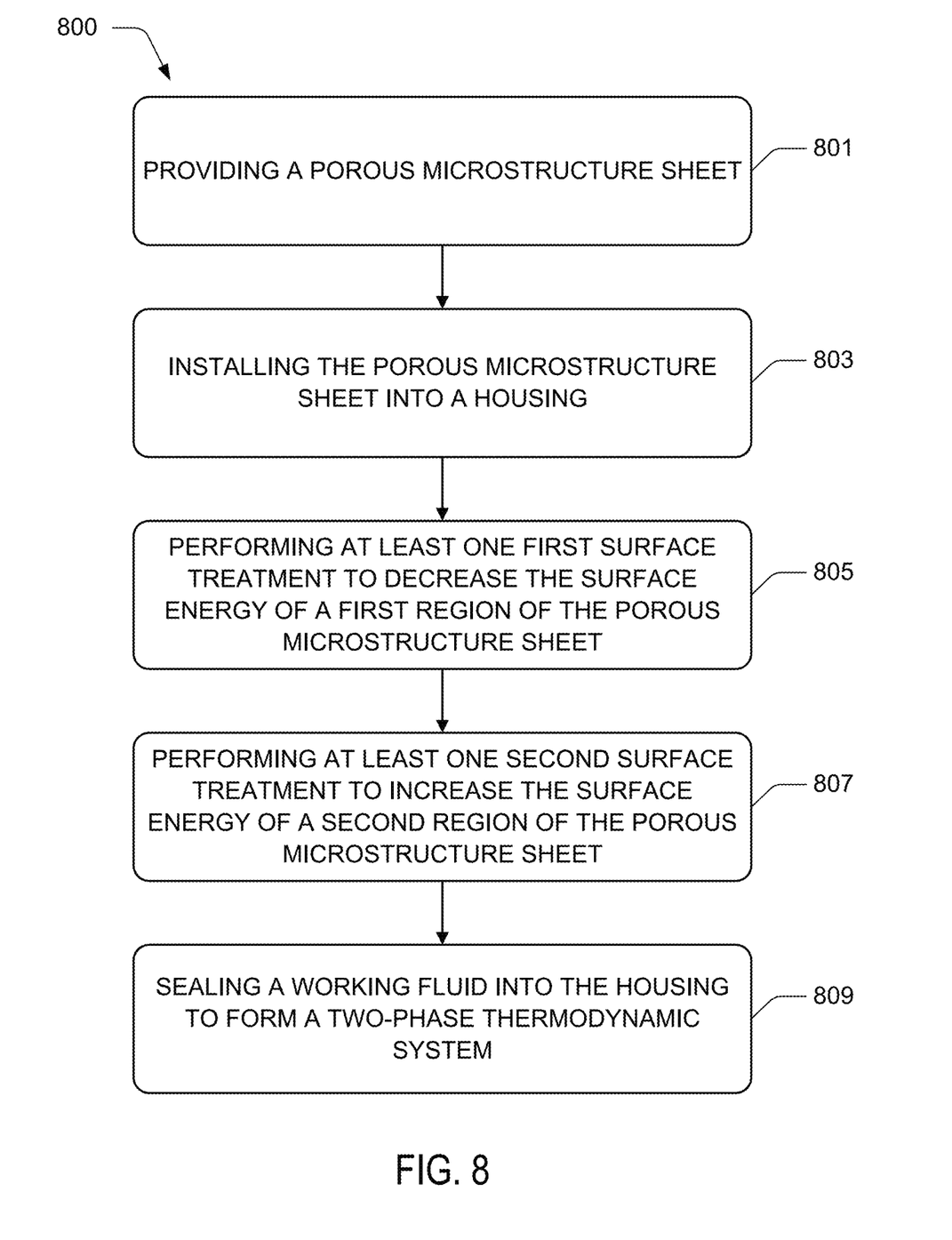
FIG. 8 is flow diagram of a process for manufacturing a two-phase thermodynamic system having internal surface energies that vary between an evaporator region and a condenser region.

Turning now to FIG. 8, a flow diagram is illustrated of a process 800 for manufacturing a two-phase thermodynamic system having internal surface energies that vary between an evaporator region and a condenser region. The process 800 is described with reference to FIGS. 2A-7. The process 800 is illustrated as a collection of blocks in a logical flow. The order in which operations are described is not intended to be construed as a limitation, and any number of the described blocks can be combined in any order and/or in parallel to implement the process. Other processes described throughout this disclosure shall be interpreted accordingly.

Step 801 includes providing a porous microstructure sheet that includes a plurality of pores. In some embodiments, the pores are arranged on the porous microstructure sheet to form an ordered grid of pores. Providing the porous microstructure sheet may etching the individual pores into a metallic foil sheet. It can be appreciated that various dry etching techniques facilitate the formation of microstructures having relatively high aspect ratio. For example, various dry etching techniques enable the formation of deep "pin" holes type microstructures. An exemplary such dry-etching technique may include, but is not limited to, reactive-ion etching which is commonly used in microfabrication. In addition to dry etching techniques, any other manufacturing technique that is suitable for forming the plurality of pores into a metallic foil may also be deployed to form the porous microstructure sheet.

Step 803 includes installing the porous microstructure sheet into a housing. For example, the porous microstructure sheet may be welded onto one or more of a plurality of ribs that form channels extending from one end of the housing to the other end of the housing. It can be appreciated that the different (e.g., opposite) ends of the housing may serve as the condenser region and the evaporator region after completion of the process 800.

Step 805 includes performing at least one first surface treatment to decrease the surface energy of a first region of the porous microstructure sheet (and/or housing). Operation 805 may include at least partially submerging a first end of the porous microstructure sheet into a chemical bath treatment to decrease the surface energy of the first end of the porous microstructure sheet. For example, the at least one first surface treatment may increase the hydrophobicity of the first end. As described above, increasing the hydrophobicity prevents the working fluid from becoming trapped within the first end—thereby improving the efficiency with which the first end can serve as a condenser region.

Step 807 includes performing at least one second surface treatment to increase the surface energy of a second region of the porous microstructure sheet (and/or housing). Operation 807 may include at least partially submerging a second end of the porous microstructure sheet, that is opposite the first end, into a chemical bath treatment to increase the surface energy of the second end of the porous microstructure sheet. For example, the at least one second surface treatment may increase the hydrophilicity of the second end. As described above, increasing the hydrophilicity ensures that the working fluid sufficiently wets-out the internal surfaces of the individual pores (e.g., of the porous microstructure sheet) that reside within the evaporator region. In this way, the working fluid is induced to abundantly form thin-film evaporation regions.

In some embodiments, one or both of operations 805 and/or 807 occur after the porous microstructure sheet is installed into the housing (e.g., after operation 803). Alternatively, operation 805 and/or 807 may occur prior to the porous microstructure sheet being installed into the housing.

Step 809 includes sealing a working fluid into the housing to form a two-phase thermodynamic system. For example, operation 809 may include sealing one or both of the first end of the porous microstructure sheet and/or the second end of the microporous sheet.

EXAMPLE CLAUSES

The disclosure presented herein may be considered in view of the following clauses.

Example Clause A, a thermodynamic system, comprising: one or more walls having inner surfaces that form a sealed cavity that contains a bi-phase fluid, the bi-phase fluid having at least a vapor fraction and a liquid fraction; a plurality of ribs forming channels that extend from an evaporator region of the sealed cavity to a condenser region of the sealed cavity, the evaporator region for absorbing heat into the bi-phase fluid to convert the liquid fraction into the vapor fraction, the condenser region for dissipating the heat out of the bi-phase fluid to convert the vapor fraction into the liquid fraction; and a porous microstructure sheet having a plurality of pores that individually induce the liquid fraction to form one or more thin-film evaporation regions within at least a portion of the evaporator region, wherein first internal surfaces of at least some first pores within the evaporator region have a first surface energy and second internal surfaces of at least some second pores within the condenser region have a second surface energy that is less than the first surface energy.

Example Clause B, the thermodynamic system of Example Clause A, wherein the porous microstructure sheet is disposed over the plurality of ribs to form a boundary between a liquid flow path defined by the channels and a vapor flow path.

Example Clause C, the thermodynamic system of any one of Example Clauses A through B, wherein the first surface energy is achieved by applying one or more surface treatments to the porous microstructure sheet to increase a level of hydrophilicity of the first internal surfaces of the at least some first pores.

Example Clause D, the thermodynamic system of any one of Example Clauses A through C, wherein the second surface energy is achieved by applying one or more surface treatments to the porous microstructure sheet to increase a level of hydrophobicity of the second internal surfaces of the at least some second pores.

Example Clause E, the thermodynamic system of any one of Example Clauses A through D, wherein at least a portion of the porous microstructure sheet that resides within an adiabatic region have a third surface energy that is less than the first surface energy and greater than the second surface energy.

Example Clause F, the thermodynamic system of any one of Example Clauses A through E, wherein the first surface energy causes the liquid fraction of the bi-phase fluid to form an acute contact angle at the first internal surfaces within the evaporator region.

Example Clause G, the thermodynamic system of any one of Example Clauses A through F, wherein the second surface energy causes the liquid fraction of the bi-phase fluid to form an obtuse contact angle at the second internal surfaces within the condenser region.

Example Clause H, the thermodynamic system of any one of Example Clauses A through G, wherein the porous microstructure sheet is a sintered-metal-powder sheet that is disposed over the plurality of ribs.

Example Clause I, the thermodynamic system of any one of Example Clauses A through H, wherein individual pores of the plurality of pores include at least three inner walls that intersect to form at least three interior corners that attract the liquid fraction to form corresponding pairs of thin-film evaporation regions.

Example Clause J, a thermodynamic system, comprising: a plurality of walls having inner surfaces that form a sealed cavity that contains a liquid fraction of a bi-phase and a vapor fraction of the bi-phase fluid, the sealed cavity having an evaporator region for absorbing heat to convert the liquid fraction into the vapor fraction and a condenser region for dissipating the heat to convert the vapor fraction into the liquid fraction; a liquid flow path through which the liquid fraction flows from the condenser region to the evaporator region; a vapor flow path through which the vapor fraction flows from the evaporator region to the condenser region; and a porous microstructure sheet having a first surface energy at first internal surfaces of at least some first pores within the evaporator region and a second surface energy at second internal surfaces of at least some second pores within the condenser region.

Example Clause K, the thermodynamic system of Example Clause J, wherein: the first surface energy results from one or more first surface treatments that increase a level of hydrophilicity of the first internal surfaces of the at least some first pores, and the second surface energy results from one or more second surface treatments that increase a level of hydrophobicity of the second internal surfaces of the at least second first pores.

Example Clause L, the thermodynamic system of any one of Example Clauses J through K, wherein the first surface energy causes the liquid fraction of the bi-phase fluid to form a first contact angle at the first internal surfaces within the evaporator region, and wherein the second surface energy causes the liquid fraction of the bi-phase fluid to form a second contact angle, that is greater than the first contact angle, at the second internal surfaces within the condenser region.

Example Clause M, the thermodynamic system of any one of Example Clauses A through L, wherein the porous microstructure sheet is a sintered-metal-powder sheet that has been exposed to one or more surface treatments to increase a level of hydrophilicity of the first internal surfaces of the at least some first pores.

Example Clause N, the thermodynamic system of any one of Example Clauses A through M, further comprising a plurality of channels that induce capillary forces on the liquid fraction to bias movement of the liquid fraction from the condenser region to the evaporator region.

Example Clause O, the thermodynamic system of any one of Example Clauses A through N, wherein the porous microstructure sheet is mechanically coupled to a top end of the plurality of channels.

Example Clause P, a method of manufacturing a thermal management system, the method comprising: providing a porous microstructure sheet that includes a plurality of pores; installing the porous microstructure sheet into a housing, wherein at least a portion of the porous microstructure sheet resides within an evaporator region of the thermal management system; performing at least one surface treatment to increase a level of hydrophilicity of the portion of the porous microstructure sheet that resides within the evaporator region of the thermal management system; and sealing a working fluid into the housing to form the two-phase thermodynamic system.

Example Clause Q, the method of Example Clause P, further comprising: performing at least one other surface treatment to increase a level of hydrophobicity of another portion of the porous microstructure sheet that resides within a condenser region of the thermal management system.

Example Clause R, the method of any one of Example Clauses P through Q, wherein the providing the porous microstructure sheet that includes the plurality of pores includes etching individual pores of the plurality of pores into a metallic foil sheet.

Example Clause S, the method of any one of Example Clauses P through R, wherein the performing the at least one surface treatment includes at least partially submerging the portion of the porous microstructure sheet that resides within the evaporator region into a chemical bath treatment to increase the level of hydrophilicity.

Example Clause T, the method of any one of Example Clauses P through S, wherein the at least one surface treatment is performed subsequent to the porous microstructure sheet being installed into the housing.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A method of manufacturing a thermal management system, the method comprising:
    providing a porous microstructure sheet that includes a plurality of pores;
    installing the porous microstructure sheet into a housing, wherein:
        a first portion of the porous microstructure sheet resides within an evaporator region of the thermal management system, and
        a second portion of the porous microstructure sheet resides within a condenser region of the thermal management system;
    performing a first surface treatment to increase a level of hydrophilicity of the first portion of the porous microstructure sheet that resides within the evaporator region of the thermal management system;
    performing a second surface treatment to increase a level of hydrophobicity of the second portion of the porous microstructure sheet that resides within the condenser region of the thermal management system; and
    sealing a working fluid into the housing to form the thermal management system.

2. The method of claim 1, wherein the first surface treatment and the second surface treatment results in an adiabatic region of the thermal management system having an intermediary surface energy that is less than the evaporator region and greater than the condenser region.

3. The method of claim 1, wherein at least one of the first surface treatment or the second surface treatment is performed subsequent to the porous microstructure sheet being installed into the housing.

4. The method of claim 1, wherein the installing the porous microstructure sheet into the housing includes mechanically affixing the porous microstructure sheet to one or more ribs that form channels extending from the evaporator region to a condenser region.

5. The method of claim 1, wherein the performing the first surface treatment includes at least partially submerging the first portion of the porous microstructure sheet that resides within the evaporator region into a chemical bath treatment to increase the level of hydrophilicity.

6. The method of claim 1, wherein the performing the second surface treatment includes at least partially submerging the second portion of the porous microstructure sheet that resides within the condenser region into a chemical bath treatment to increase the level of hydrophobicity.

7. The method of claim 1, wherein the porous microstructure sheet includes a plurality of pores that are formed through reactive-ion etching.

8. The method of claim 7, wherein:
the performing the first surface treatment increases the level of hydrophilicity within a first subset of the plurality of pores that are formed through the reactive-ion etching; and
the performing the second surface treatment increases the level of hydrophobicity within a second subset of the plurality of pores that are formed through the reactive-ion etching.

9. A method of manufacturing a two-phase thermodynamic system, the method comprising:
providing a porous microstructure sheet that includes a plurality of pores;
installing the porous microstructure sheet into a housing, wherein at least a portion of the porous microstructure sheet resides within an evaporator region of the two-phase thermodynamic system;
performing at least one surface treatment to increase a level of hydrophilicity of the portion of the porous microstructure sheet that resides within the evaporator region of the two-phase thermodynamic system; and
sealing a working fluid into the housing to form the two-phase thermodynamic system.

10. The method of claim 9, further comprising:
performing at least one other surface treatment to increase a level of hydrophobicity of another portion of the porous microstructure sheet that resides within a condenser region of the two-phase thermodynamic system.

11. The method of claim 10, wherein the at least one surface treatment and the at least one other surface treatment results in an adiabatic region of the two-phase thermodynamic system having an intermediary surface energy that is less than the evaporator region and greater than the condenser region.

12. The method of claim 9, wherein the providing the porous microstructure sheet that includes the plurality of pores includes etching individual pores of the plurality of pores into a metallic foil sheet.

13. The method of claim 9, wherein the performing the at least one surface treatment includes at least partially submerging the portion of the porous microstructure sheet that resides within the evaporator region into a chemical bath treatment to increase the level of hydrophilicity.

14. The method of claim 9, wherein the at least one surface treatment is performed subsequent to the porous microstructure sheet being installed into the housing.

15. The method of claim 9, wherein the installing the porous microstructure sheet into the housing includes mechanically affixing the porous microstructure sheet to one or more ribs that form channels extending from the evaporator region to a condenser region.

16. The method of claim 9, wherein the porous microstructure sheet includes a plurality of pores that are formed through reactive-ion etching.

17. The method of claim 16, wherein the performing the at least one surface treatment increases the level of hydrophilicity within a subset of the plurality of pores that are formed through the reactive-ion etching.

18. A method of manufacturing a two-phase thermodynamic system, the method comprising:
providing a porous microstructure sheet that includes a plurality of pores;
installing the porous microstructure sheet into a housing, wherein at least a portion of the porous microstructure sheet resides within a condenser region of the thermal management system;
performing at least one surface treatment to increase a level of hydrophobicity of the portion of the porous microstructure sheet that resides within the condenser region of the two-phase thermodynamic system; and
sealing a working fluid into the housing to form the two-phase thermodynamic system.

19. The method of claim 18, wherein the performing the at least one surface treatment includes at least partially submerging the portion of the porous microstructure sheet that resides within the condenser region into a chemical bath treatment to increase the level of hydrophobicity.

20. The method of claim 18, wherein the porous microstructure sheet includes a plurality of pores that are formed through reactive-ion etching.

* * * * *